US006788112B1

(12) United States Patent
Chan et al.

(10) Patent No.: US 6,788,112 B1
(45) Date of Patent: Sep. 7, 2004

(54) HIGH PERFORMANCE DUAL-STAGE SENSE AMPLIFIER CIRCUIT

(75) Inventors: Yuen H. Chan, Poughkeepsie, NY (US); Rajiv Joshi, Yorktown Heights, NY (US); Antonio R. Pelella, Highland Falls, NY (US); John R. Rawlins, New Paltz, NY (US); Jatinder K. Wadhwa, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/436,229

(22) Filed: May 12, 2003

(51) Int. Cl.[7] .................................... G01R 19/00

(52) U.S. Cl. .................... 327/51; 327/55; 327/57; 365/189.05; 365/230.09

(58) Field of Search .................... 327/51–57; 365/49, 365/222, 230.09, 189.05

(56) References Cited

U.S. PATENT DOCUMENTS

| | | | | |
|---|---|---|---|---|
| 4,716,320 A | | 12/1987 | McAdams | 327/52 |
| 4,804,871 A | | 2/1989 | Walters, Jr. | 807/530 |
| 5,127,739 A | | 7/1992 | Duvvury et al. | 365/189.11 |
| 5,280,205 A | * | 1/1994 | Green et al. | 327/51 |
| 5,343,433 A | | 8/1994 | Duvvury et al. | 365/205 |
| 5,627,484 A | | 5/1997 | Tuminaro et al. | 327/56 |
| 5,804,992 A | * | 9/1998 | Lee | 327/51 |
| 6,275,432 B1 | * | 8/2001 | Hardee | 365/205 |

* cited by examiner

*Primary Examiner*—Timothy P. Callahan
*Assistant Examiner*—An T. Luu
(74) *Attorney, Agent, or Firm*—Lynn Augspurger; Cantor Colburn LLP

(57) ABSTRACT

A sense amplifier for a memory device comprising: a first sensing stage comprising a first sensing device and a second sensing device operably connected to a first sense line and a second sense line respectively, to reduce the capacitive load on the first sense line and second sense line. A source terminal of the sensing device is connected to a switchable current sink with drain terminal thereof connected to an input of a second sensing stage. The sense amplifier also includes a second sensing stage comprising cross-coupled inverters responsive to the first sensing stage, the second sensing stage is activated by a sense enable signal following a selected delay, and an output driver responsive to the second sensing stage.

25 Claims, 5 Drawing Sheets

HIGH PERFORMANCE DUAL-STAGE SENSE AMPLIFIER CIRCUIT

BACKGROUND

Existing complementary metal oxide semiconductor (CMOS) memories consist of a large number of individual memory cells each storing an electrical charge corresponding to a digital 0 or a digital 1 state. The memory includes a number of cells each representing a plurality of multi-bit words. When a particular cell is read, a small voltage signal corresponding to the state of the cell is generated on a bit line connected to a sense amplifier (see FIG. 1). The sense amplifier discriminates between a small (lower) bit line output voltage representative of digital 0 state and a somewhat larger (higher) bit line voltage representative of a digital 1 state. High performance, high density CMOS static random access memories (SRAM) are preferably read at a very high speed to be compatible with the very high speed microprocessors. One of the greatest impediments to high speed performance results from the circuitry for amplifying a small analog array cell signal on a single bit line into a full swing digital signal. Further, one of the major problems presented for rapid readout of an analog signal is the time required to discriminate between a 0 signal and a 1 signal and the time to produce an output signal once the input signal has been properly discriminated.

Some existing sense amplifier designs require a large bit line voltage swing to properly trigger the state of the signal detection circuitry, thus increasing the memory access time. Other sense amplifier designs add large capacitive load to the bit line, hence slowing the signal development rate on the bit line. As a result, a significant period of time is required for a full sense signal to be generated, adding a substantial delay to the SRAM speed. Therefore, there is a need for a sense amplifier that exhibits low loading capacitance and facilitates higher speed sensing.

BRIEF SUMMARY OF THE EXEMPLARY EMBODIMENTS

Disclosed herein in an exemplary embodiment is a sense amplifier for a memory device comprising: a first sensing stage comprising a first sensing device and a second sensing device operably connected to a first sense line and a second sense line respectively, to reduce the capacitive load on the first sense line and the second sense line. A source terminal of the sensing device is connected to a switchable current sink with drain terminal thereof connected to an input of a second sensing stage. The sense amplifier also includes a second sensing stage comprising cross-coupled inverters responsive to the first sensing stage, the second sensing stage is activated by a sense enable signal following a selected delay, and an output driver responsive to the second sensing stage.

Also disclosed herein in an exemplary embodiment is a sense amplifier for a memory device comprising: a first sensing stage comprising a first sensing device and a second sensing device operably connected to a first sense line and a second sense line, respectively, to reduce capacitive load on the first sense line and the second sense line. A source terminal of the sensing device is connected to a switchable current sink with drain terminal thereof connected to an input of a second sensing stage. The sense amplifier also includes: a second sensing stage comprising a pair of cross-coupled complementary inverters coupled to the switchable current sink, responsive to the first sensing stage and operably connected to the first sense line and the second sense line, the second sensing stage activated by a sense enable signal; and an output driver responsive to the second sensing stage.

Further disclosed herein in yet another exemplary embodiment is a method of detecting a signal on a pair of complementary sense lines in a dual-stage sense amplifier for a memory device comprising: detecting a differential voltage between a first sense line and a second sense line with a first sensing stage comprising a first sensing device and a second sensing device; amplifying said differential voltage with a second sensing stage comprising cross-coupled inverters responsive to the first sensing stage. The second sensing stage is activated by a sense enable signal following a selected delay, wherein the first sensing stage is deactivated once the second sensing stage is activated. The method also includes generating a output signal with an output driver responsive to the second sensing stage.

Also disclosed herein in yet another exemplary embodiment is a method of detecting a signal on a pair of complementary sense lines in a dual-stage sense amplifier for a memory device comprising: detecting a differential voltage between a first sense line and a second sense line with a first sensing stage comprising a first sensing device and a second sensing device; amplifying the differential voltage with a second sensing stage comprising cross-coupled inverters responsive to and in parallel with said first sensing stage, the second sensing stage activated by a sense enable signal. The method also includes generating a output signal with an output driver responsive to the second sensing stage.

These and other improvements are set forth in the following detailed description. For a better understanding of the invention with advantages and features, refer to the description and to the drawings.

BRIEF DESCRIPTION OF THE DRAWINGS

The present invention will now be described, by way of an example, with references to the accompanying drawings, wherein like elements are numbered alike in the several figures in which.

Our detailed description explains the preferred embodiments of our invention, together with advantages and features, by way of example with reference to the drawings.

DETAILED DESCRIPTION OF AN EXEMPLARY EMBODIMENT

Figure 2:
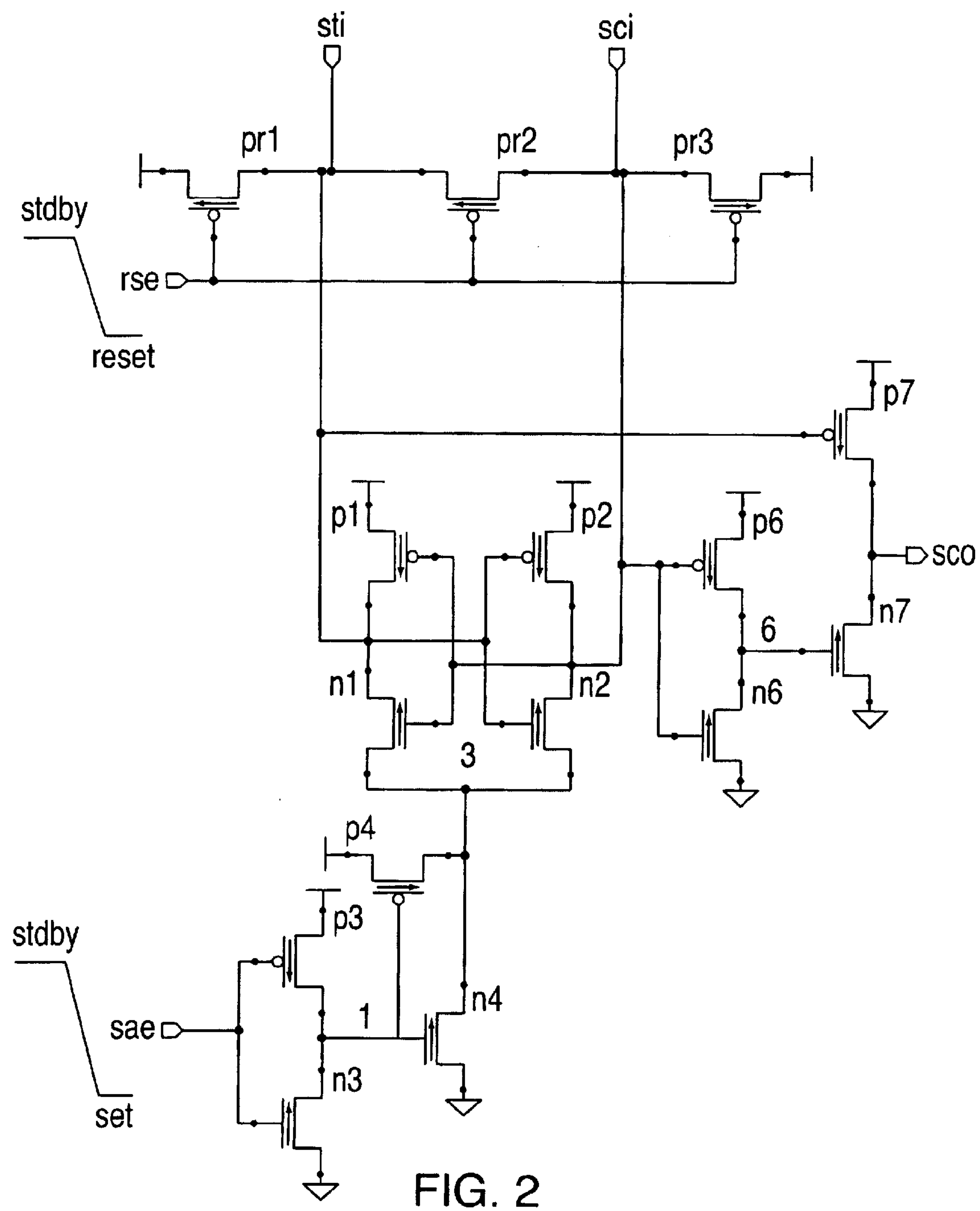
FIG. 2 illustrates an existing sense amplifier design with large input capacitive load and single stage sensing.

Low power and fast speed are critical factors in the state of the art SRAM designs. To reduce access delay and power consumption of a memory array, voltage swing on the bit lines is substantially lower than that of the supply voltage, $V_{dd}$. Typical voltage swing for a sense amplifier to operate on is around 10–15% of the $V_{dd}$ voltage. Differential sense amplifiers are used to amplify the small bit line swing to rail-to-rail full voltage amplitude. FIG. 2 depicts a simplified schematic of an existing sense amplifier configuration. During a read operation, a voltage difference develops across the bit lines. When a sufficient voltage differential is attained, the sense amplifier is turned on by the sense amplifier enable (SAE) signal. Depending upon the bit line input, the cross-coupled inverter pair traverse to a stable state with full voltage swing. However, these types of designs while well suited for there intended purposes have three shortcomings. First, the sense amplifier consists of only a single stage of amplification, hence its sensing speed is limited. Second, the cross-coupled sensing devices (both gate and drain terminals) as well as the output driver (p7 and p8/n8) are all connected directly to the bit lines, and thereby add substantial loading capacitance to the bit lines reducing the sense signal slew rate. Third, the sense lines STI and SCI switch with full swing when the sense amplifier is activated, thereby coupling the bit lines to switch with full swing as well. This increases power dissipation when the bit lines are restored at the end of a read cycle.

Figure 1:
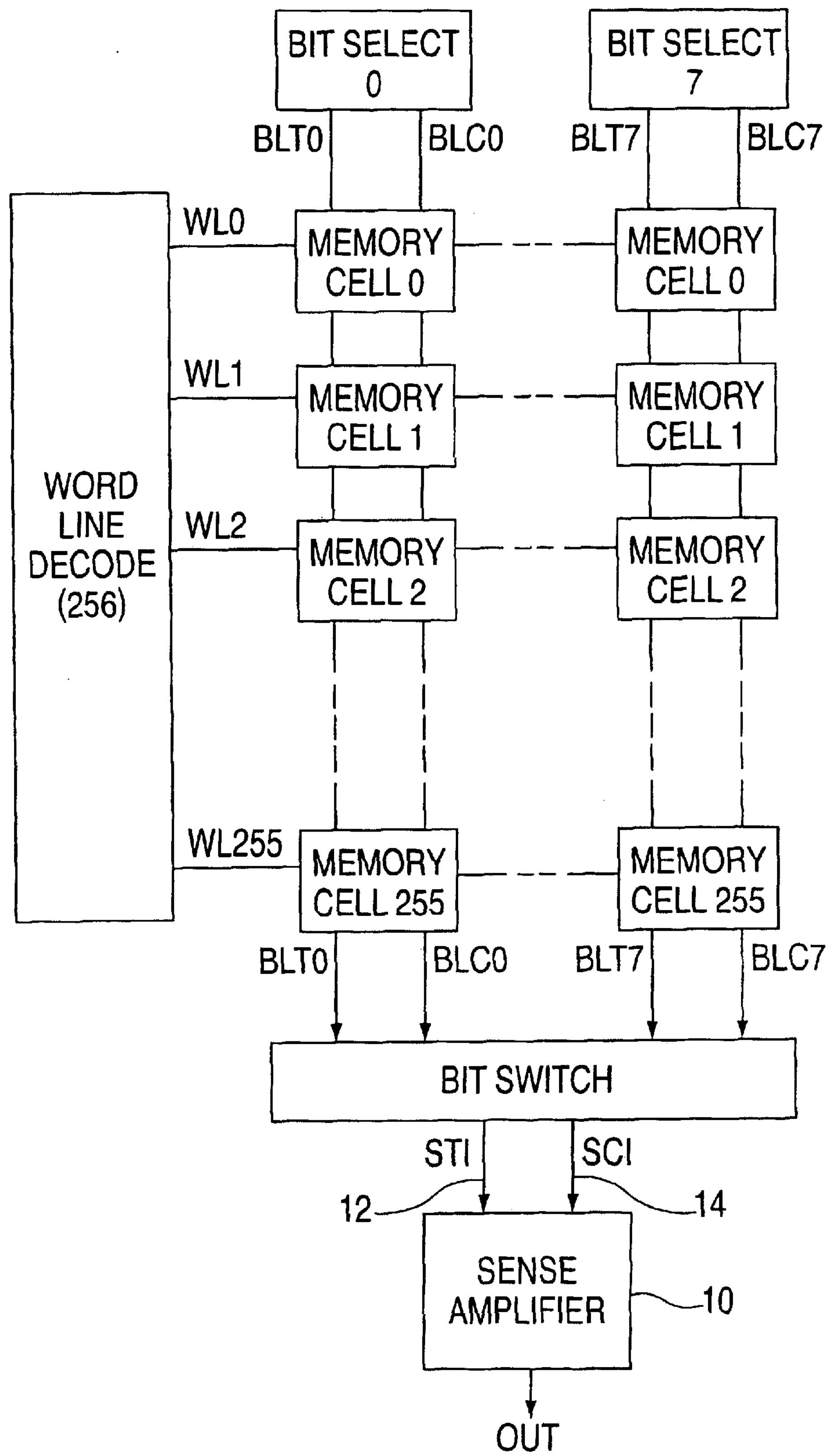
FIG. 1 illustrates a CMOS memory array with sense amplifier as may be employed with an exemplary embodiment.
Figure 3:
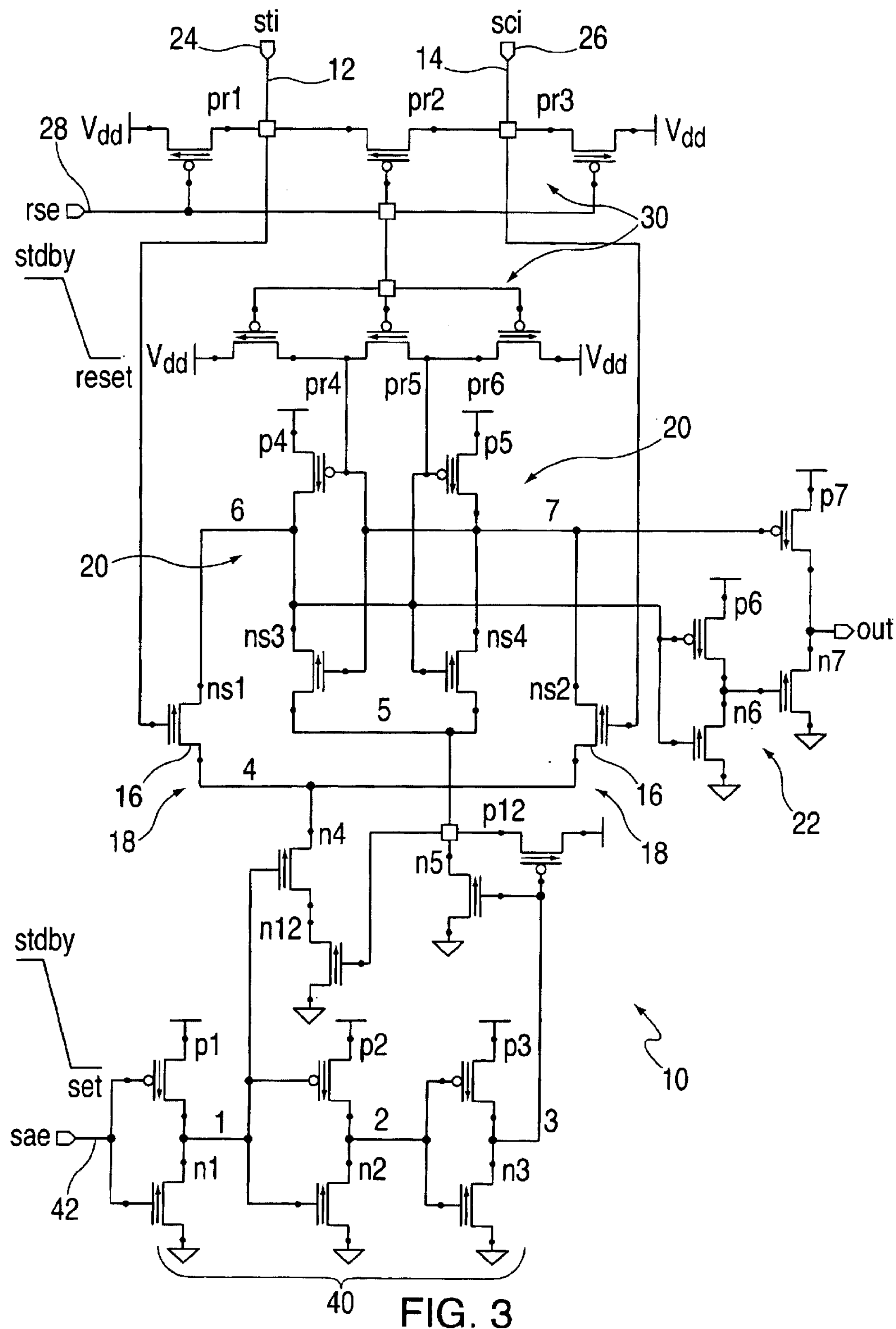
FIG. 3 illustrates the high performance dual-stage sense amplifier circuit in accordance with an exemplary embodiment.

Referring now to FIGS. 1 and 3, in an exemplary embodiment, a sense amplifier 10 is disclosed that reduces the capacitive load on the sense lines hereinafter also denoted as STI 12 and SCI 14 (Sense True Input and Sense Complement Input) as seen by the memory cells. In addition, faster sensing of the differential voltage between the sense lines, STI 12 and SCI 14, is provided by employing two stages of amplification. From these two factors, the SRAM read access time is substantially improved. In order to implement the sense amplifier 10 of on an exemplary embodiment, the sense amplifier of an existing configuration (FIG. 2) is modified to include, but not be limited to, dual-stage (cascading) amplification. The STI 12 and SCI 14 are the lines and nodes connected to the sense amplifier inputs. The sense lines STI 12 and SCI 14 are connected only to high impedance sensing devices 16. In an exemplary embodiment, the sense lines STI 12 and SCI 14 are connected to the gates of the n-channel metal oxide semiconductor (NMOS) transistors. The STI 12 and SCI 14 may also be described as the bit line transfer nodes, since the bit lines signals are "transferred" from the bit lines BLT and BLC (Bit Line True and Bit Line Complement) of FIG. 1 through the bit switch circuit (FIG. 1) to the STI 12 and SCI 14 inputs. The bit switch circuit may include, but not be limited to one ore more transfer gates (e.g., pass gate transistors), which are controlled by a set of bit decode signals. In a read operation, the selected transfer gate is turned on and passes the bit line signals from the bit lines BLT/BLC to the sense lines STI 12 and SCI 14.

It will be appreciated that while in an exemplary embodiment NMOS and PMOS devices are disclosed for the purposes of describing the inventions, other types of devices are possible. For example, such devices may include CMOS, other FETs, JFETS, transistors, semiconductor devices, and the like, as well as combinations including at least one of the foregoing. The configuration of the sense amplifier 10 of an exemplary embodiment reduces the load capacitance imposed on the sense lines STI 12 and SCI 14 respectively by reducing the size and count of the devices connected to the sense lines STI 12 and SCI 14. Lowering the loading capacitance facilitates development of a differential voltage on the sense lines STI 12 and SCI 14 (e.g., less capacitance to charge/discharge as the signal levels change. Likewise, employing dual-stage sensing provides a lightly loaded input stage 18 including sensing device 16 (also denoted ns1/n2) followed by a higher power second stage 20, thus enabling faster sensing time with larger output driving capability. In other words, by adding an additional stage the loading on sense lines STI 12 and SCI 14 is reduced by the number of devices driven (since the output driver is now decoupled from the STI 12 and SCI 14 nodes) as well as the size of the devices driven (since the first stage sensing devices 16 (ns1/ns2) are smaller than the devices (ns3/ns4) of the second stage, and only the gates of ns3/ns4 are connected to the STI/SCI nodes). In an exemplary embodiment, a very small device (exhibiting a very low gate capacitance as a load) is interposed between the sense lines STI 12 and SCI 14 and a second stage 20 and ultimately, the output drivers shown generally as 22. Moreover, the addition of the sensing devices 16 as a input stage 18 utilizes the gain thereof to facilitate the driving a second stage 20 and the output drivers 22.

FIG. 3 depicts a circuit schematic for an illustrative the high performance dual-stage (CMOS) sense amplifier 10 of an exemplary embodiment. The gated input (i.e., input connected to the gate of a transistor) dual-stage sensing scheme is particularly useful in situations where the bit lines (BLT's and BLC's of FIG. 1) have large number of memory cells attached thereto. In high density SRAM, there may be 128 to 256 (or more) memory cells attached to a bit line pair (e.g., BLT0 and BLC0). The bit lines BLT and BLC and devices connected thereto may exhibit significant capacitance, retarding the rate of signal development for reading. Advantageously, the gated input circuit topology of an exemplary embodiment sense amplifier 10, significantly reduces the input capacitance experienced by the bit lines and the sense amplifier input lines and nodes STI 12 and SCI 14, since only a single gate input of the sensing device 16 (e.g., an NMOS transistor) of the input stage 18 (also denoted herein as first stage) is attached to each sense line STI 12 and SCI 14. It will be appreciated that existing designs such as depicted in FIG. 2 have multiple gates, drains, and sources of the cross-coupled NMOS and PMOS sensing devices as well as the large output driving devices attached to the sense lines. With less added capacitive load on the sense lines STI 12 and SCI 14, the slew rate of the voltage on the sense lines STI 12 and SCI 14 is much improved, resulting in a quicker differential voltage development for faster sensing. Furthermore, the first stage 18 of the dual-stage circuit (e.g., first stage 18 and second stage 20 amplifies the small differential voltage on the sense lines STI 12 and SCI 14 and presents a much higher differential voltage to the cross-coupled inverters (second stage 20). This enables faster amplification of the differential voltage between the sense lines STI 12 and SCI 14 to a full rail-to-rail swing provided at the circuit output. Thus, the dual-stage sensing effectively increases the voltage gain of the sense amplifier 10 and provides for faster circuit switching. Furthermore, the output driving devices 22 (p7/n7 and p8/n8) are now detached from the sense lines STI 12 and SCI 14 and are connected to the output nodes (6 and 7 respectively in the figure), of the second stage 20 instead. This isolation of the output devices 22 from the input stage 18 not only reduces the input capacitive load on the STI 12 and SCI 14 nodes, it also enables much larger output driving devices 22 to be attached to the second stage output nodes (6/7), hence providing faster and higher output driving capability.

Continuing with FIG. 3, the sense amplifier 10 includes, but is not limited to the following five sections: input precharge, shown generally as 30; sense trigger timing 40; first stage 18 for sensing; a second stage for sensing, shown generally as 20; and an output driver shown generally as 22.

Input precharge—Input terminal 24, also denoted sti and input terminal 26, also denoted sci are connected to the sense lines STI 12 and SCI 14 respectively and/or the bit switch circuit (FIG. 1). During standby mode, or after a read operation of memory, the sense lines STI 12 and SCI 14 inputs are restored to the supply voltage, also denoted $V_{dd}$ by reset enable signal 28, also denoted rse through the pr1 & pr3 PMOS devices. PMOS device pr2 simultaneously provides sense line equalization. The reset enable signal rse 28 also restores the second stage internal voltages through PMOS devices pr4–pr5–pr6. That is, the internal voltages at the second stage 20 are also reset to the supply voltage $V_{dd}$.

Sense trigger timing 40, in this portion of the sense amplifier 10 of an exemplary embodiment, an inverter chain denoted by devices p1/n1 to p3/n3 provides buffering and delay generation for the sense enable signal 42 also denoted sac to drive the first and second stage circuits 18 and 20 respectively. As mentioned above, the first stage 18 includes, but is not limited to NMOS sensing devices 18 e.g., transistors ns1/ns2 and pull down devices n4/n12. In an exemplary embodiment, pull down device n12 is gated by a feedback signal from the second stage. The effect of this feedback is to ensure that when the second stage 20 is activated, the first stage 18 is disabled e.g., shut off. Advantageously, this approach saves significant power by reducing the number of transistors that are driven/operating simultaneously. Reductions in power dissipated reduce heat generation and facilitate utilization.

Second stage sensing, 20 includes two cross-coupled inverters p4/ns3 and p5/ns4 and n6 pull-down and p12 pull-up. The second stage 20 is activated by the sense enable signal 42 sae following a selected delay after the first stage 18 (a two inverter delay is illustrated in the figure, others are possible). The timing of the second stage 20 is determined by the desired amount of voltage differential generated by the first stage 18. When the second stage 20 is turned ON, the first stage 18 is gated OFF through the feedback device n12 as mentioned above.

The output driver 22, includes, but is not limited to, a high power push-pull circuit including transistor pairs p7/n7 and p8/n8. The push-pull circuit is connected to and driven by the second stage 20 cross-coupled inverters.

Operation of the sense amplifier 10 initiates with the precharging (establishing a known voltage at selected nodes in the sense amplifier 10. Prior to a read operation (or in standby mode), the sti/sci (sense line signals STI 12 and SCI 14) are precharged to $V_{dd}$ by lowering the reset enable input signal 28 rse to turn on the PMOS precharge devices (pr1–pr3) and (pr4–pr6). Once a read operation starts, the precharge devices are turned off by the reset enable signal 28 rse switching high. A selected memory cell on a given bit line is activated, depending on the data polarity on the memory cell, either blt or blc (FIG. 1) (connected to sti and sci respectively) is pulled lower while the other side stays high, gradually developing a small voltage differential across the sense lines STI 12 and SCI 14. When sufficient differential voltage is attained on the sti/sci inputs (this timing is predetermined by a sense amp timing generator within the SRAM structure, not shown here), the sae signal (coming from the sense amplifier timing generator) is triggered. It first turns on the first stage sensing devices 16 n4 and ns1/ns2 to pre-amplify the input sense line differential. These transistors help build a bigger differential voltage on internal nodes 6 & 7 which feed directly to the cross-coupled second stage 20, complementary devices p4/ns3 & p5/ns4. After the two-inverter delay 40 from p2/n2 and p3/n3, current source device n5 is switched on to activate the second stage 20 sensing. The cross-coupled transistor pairs now see a much larger differential voltage on nodes 6 & 7 and further amplify this voltage to full $V_{dd}$ swing, driving the push-pull output devices 22 either p7 or n7 to be on.

Figure 4:
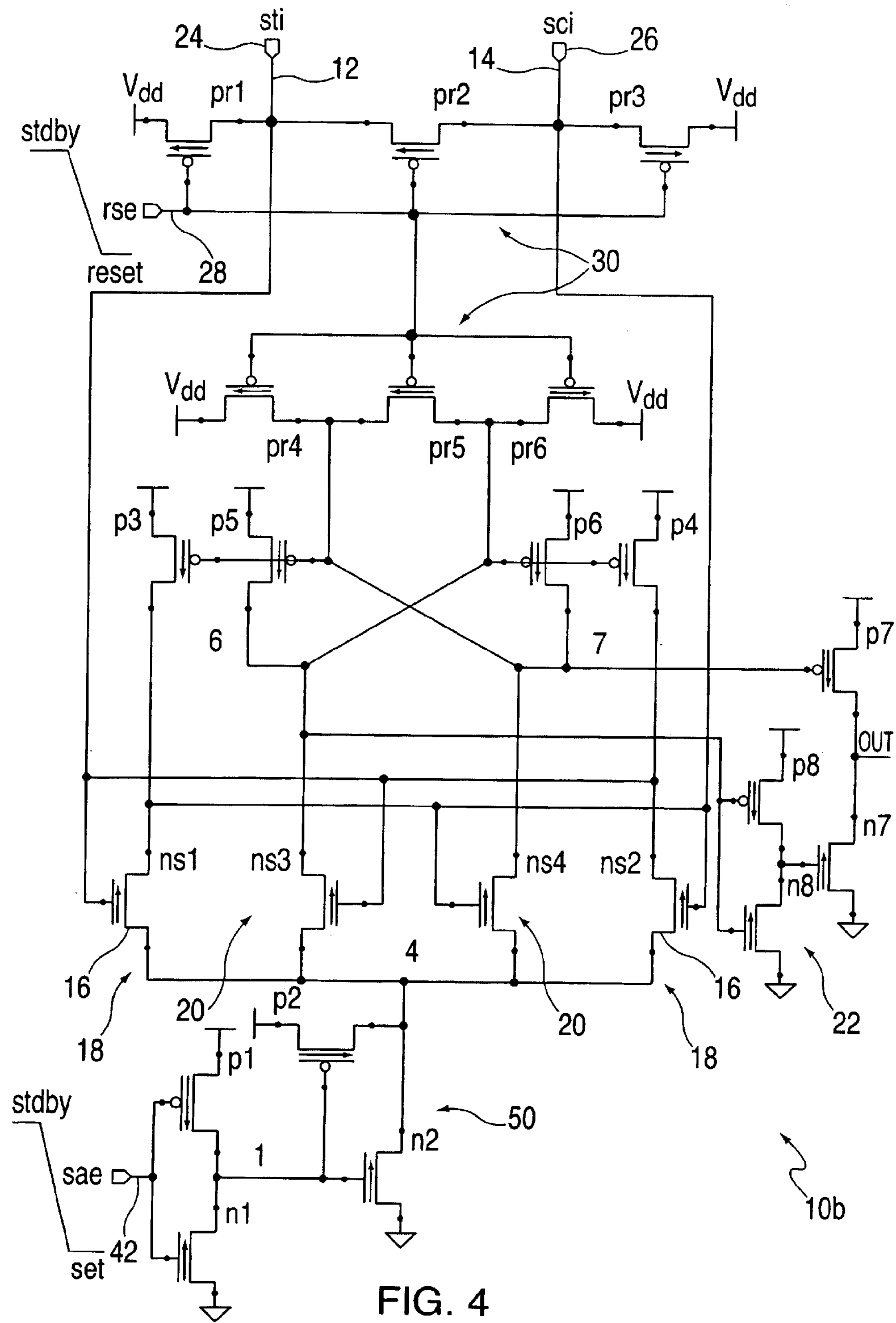
FIG. 4 illustrates one version of the high performance parallel stage sense amplifier circuit having true and complement dynamic outputs in accordance with an exemplary embodiment.

Referring now to FIGS. 1 and 4, in another exemplary embodiment, a sense amplifier 10 is disclosed that reduces the capacitive load on the sense lines STI 12 and SCI 14 (Sense True Input and Sense Complement Input) as seen by the memory cells. In addition, faster sensing of the differential voltage between the sense lines, STI 12 and SCI 14, is provided by employing two parallel stages of amplification. From these two factors, the SRAM read access time is substantially improved. Once again, in order to implement the sense amplifier 10*a* of this exemplary embodiment, the sense amplifier of an existing configuration (FIG. 2) is modified to include, but not be limited to, dual-stage (parallel) amplification. The STI 12 and SCI 14 are the lines and nodes connected to the sense amplifier inputs. In this embodiment, the sense lines STI 12 and SCI 14 are connected to the gate and drain respectively of the first sensing device 16 (denoted in the figure as ns1) of the first stage 20, and vice versa for the second sensing device 16 (denoted in the figure as ns2) of the first stage 18. In addition, the sense lines STI 12 and SCI 14 are connected to the gate of sensing devices of the second stage 20 (denoted in the figure as ns3/ns4). As discussed previously, the sense lines STI 12 and SCI 14 are connected to the gates and drain of the n-channel metal oxide semiconductor (NMOS) transistors. The STI 12 and SCI 14 may also be described as the bit line transfer nodes, since the bit lines signals are "transferred" from the bit lines BLT and BLC (Bit Line True and Bit Line Complement) of FIG. 1. through the bit switch circuit (FIG. 1) to the STI 12 and SCI 14 inputs. The bit switch circuit may include, but not be limited to one or more transfer gates (e.g., pass gate transistors), which are controlled by a set of bit decode signals. In a read operation, the selected transfer gate is turned on and passes the bit line signals from the bit lines BLT/BLC to the sense lines STI 12 and SCI 14.

Once again, it will be appreciated that while in an exemplary embodiment NMOS and PMOS devices are disclosed for the purposes of describing the inventions, other types of devices are possible. For example, such devices may include CMOS, other FETs, JFETS, transistors, semiconductor devices, and the like, as well as combinations including at least one of the foregoing. The configuration of the sense amplifier 10*a* of an exemplary embodiment reduces the load capacitance imposed on the sense lines STI 12 and SCI 14 respectively by reducing the size and count of the devices connected to the sense lines STI 12 and SCI 14. Lowering the loading capacitance facilitates development of a differential voltage on the sense lines STI 12 and SCI 14 (e.g., less capacitance to charge/discharge as the signal levels change. Likewise, employing parallel dual-stage sensing provides a lightly loaded input/first stage 18 including sensing devices 16 (ns1/ns2) followed by a higher power second stage 20 (including devices ns3/ns4), thus enabling faster sensing time with larger output driving capability. In other words; by adding an additional stage the loading on sense lines STI 12 and SCI 14 is reduced by the number of devices driven (since the output driver is now substantially decoupled from the STI 12 and SCI 14 nodes) as well as the size of the devices driven (since the first stage sensing devices ns1/ns2 are smaller than the ns3/ns4 of the second stage, and only the gates of ns3/ns4 are connected to the STI/SCI nodes). In an exemplary embodiment, a very small devices (exhibiting a very low gate and drain capacitance as a load) are interposed between the sense lines STI 12 and SCI 14 and a second stage 20 and ultimately, the output drivers shown generally as 22. Moreover, the addition of the sensing devices 16 as a input stage 18 utilizes the gain thereof to facilitate the driving a second stage 20 and the output drivers 22.

FIG. 4 depicts a circuit schematic for an illustrative the high performance parallel dual-stage (CMOS) sense amplifier 10*a* of an exemplary embodiment. The parallel dual-stage sensing scheme is particularly useful in situations where the bit lines (BLT's and BLC's of FIG. 1) have large number of memory cells attached thereto. In high density SRAM, there may be 128 to 256 (or more) memory cells attached to a bit line pair (e.g., BLT0 and BLC0). The bit lines BLT and BLC and devices connected thereto may exhibit significant capacitance, retarding the rate of signal development for reading. Advantageously, the input circuit topology of an exemplary embodiment sense amplifier 10*a*, significantly reduces the input capacitance experienced by the bit lines and the sense amplifier input lines and nodes STI 12 and SCI 14, since the sensing devices 16 (ns1/ns2) of the input stage 18 are small in size, and the gates of the sensing device(s) (ns3/ns4) of the second stage 20 are attached to each sense line STI 12 and SCI 14. It will be appreciated that existing designs such as depicted in FIG. 2 have multiple gates, drains, and sources of the cross-coupled NMOS and PMOS sensing devices as well as the large output driving devices attached to the sense lines. With less added capacitive load on the sense lines STI 12 and SCI 14, the slew rate of the voltage on the sense lines STI 12 and SCI 14 is much improved, resulting in a quicker differential voltage development for faster sensing. Furthermore, the first stage 18 of the dual-stage circuit (e.g., first stage 18 and second stage 20 amplifies the small differential voltage on the sense lines STI 12 and SCI 14 and presents a much higher differential voltage to the cross-coupled complementary devices ns3/p5 and ns4/p6 (second stage 20). This enables faster amplification of the differential voltage between the sense lines STI 12 and SCI 14 to a full rail-to-rail swing provided at the circuit output. Thus, the dual-stage sensing effectively increases the voltage gain of the sense amplifier 10*a* and provides for faster circuit switching. Furthermore, the output driving devices (p7/n7 and p8/n8) are now detached from the sense lines STI 12 and SCI 14 and are connected to the output nodes (6 and 7 respectively in the figure) of the second stage 20 instead. This isolation of the output devices 22 from the input stage 18 not only reduces the input capacitive load on the STI 12 and SCI 14 nodes, it also enables much larger output driving devices 22 to be attached to the second stage output nodes (6/7), hence providing faster and higher output driving capability.

Another major advantage of the parallel dual-stage circuit topology of the sense amplifier 10*a* is that, the first stage sensing devices 16 (ns1/ns2 and second stage 20 sensing devices ns3/ns4) are activated together at the same time by the same current sink 50 also denoted as n2 in FIG. 4. Hence the parallel dual-stage notion. Advantageously, such a configuration for the sense amplifier 10*a* reduces circuit switching delay significantly (since the switching of the second stage 20 no longer has to wait for the completion of the first stage 18, as would be the case with a normal cascade circuit topology). The first and second stages 18 and 20 are turned-on at the same time but with different current ratio (e.g., gain). In an exemplary embodiment, the first stage sensing device(s) 16 (ns1/ns2) are selected as smaller devices than those of the second stages 20 (e.g., n3/n4 in the figure), thus the switching current in the switching device(s) 16 of the first stage 18 is a fraction of that of the second stage. Advantageously this configuration for the sense amplifier 10*a* allows the first stage 18 to have a smaller loading effect on the sense lines STI 12 and SCI 14, while enabling the second stage 20 to have a much higher power driving capability. Having a lower current load from the first stage 18 to pull down on the sense lines STI 12 and SCI 14, and thereby, the bit lines, will result in a smaller voltage swing. That is, a smaller voltage swing than that of the configuration depicted in FIG. 2, which is close to a rail-to-rail voltage swing. Power dissipation for a restore at the end of a read operation is therefore reduced. Reductions in power dissipated reduce heat generation and facilitate utilization.

Continuing with FIG. 4, the sense amplifier 10*a* includes, but is not limited to the following five sections: input precharge, shown generally as 30; sense trigger timing 40; first stage 18 for sensing; a second stage for sensing, shown generally as 20; and an output driver shown generally as 22.

Input precharge Input terminal 24, also denoted sti and input terminal 26, also denoted sci are connected to the sense lines STI 12 and SCI 14 respectively and/or the bit switch circuit (FIG. 1). During standby mode, or after a read operation of memory, the sense lines STI 12 and SCI 14 inputs are restored to the supply voltage, also denoted $V_{dd}$ by reset enable signal 28, also denoted rse through the pr1 & pr3 PMOS devices. PMOS device pr2 simultaneously provides sense line equalization. The reset enable signal rse 28 also restores the second stage internal voltages (nodes 6 and 7) through PMOS devices pr4–pr5–pr6. That is, the internal voltages at the second stage 20 are also reset to the supply voltage $V_{dd}$.

Sense trigger timing 40, in this portion of the sense amplifier 10 of an exemplary embodiment, comprising an inverter denoted by devices p1/n1 and pull-up/pull-down devices p2/n2 provide buffering and current sink 50 for the sense enable signal 42 also denoted sae to drive the first and second stage circuits 18 and 20 simultaneously.

As mentioned above, the first stage 18 includes, but is not limited to NMOS sensing devices 18 e.g., transistors ns1/ns2 and pull down devices n2. The first stage sensing device(s) 16 ns1/ns2 have their drain terminals cross-coupled with the sense lines STI 12 and SCI 14 as well as with the pull up PMOS devices p3/p4 respectively. As stated above, both ns1/ns2 and p3/p4 are chosen to be small devices to reduce switching current as well as capacitive loading on the sense lines STI 12 and SCI 14. Outputs of this first stage sensing 16 are cross-coupled back to the sense lines STI 12 and SCI 14 and drive the input gates of switching devices (ns3/ns4) of the second stage 20. Advantageously, this approach decouples the drain terminals (the high power switching nodes) of ns3/ns4 from the first stage 18, thereby isolating the large output driving devices from loading down on the sense lines STI 12 and SCI 14. As a result, a faster sensing speed is attained.

Second stage sensing, 20 includes two cross-coupled complementary devices ns3/p5 and ns4/p6. P5 and p6 provide cross-coupled pull up for nodes 6 and 7. Inputs for this second stage 20 are the gates of the sensing device(s) ns3/ns4, which are connected to the output of the first stage 20 as described above. Outputs of the second stage 20 are nodes 6 and 7, which provides a high power rail-to-rail switching for the output driver 22. Nodes 6 and 7 also drive the PMOS devices p5/p6 to provide cross-coupled feedback pull up for nodes 6 or 7 respectively, and the PMOS devices p3/p4 to provide similar cross-coupled feedback pull up on the sense lines STI 12 and SCI 14. The source terminals of the second stage 20 (i.e., the source of ns3/ns4) are connected to the source terminals of the switching devices 16 of first stage 18. This common source node is driven by a single switching current sink 50 (n2) so that the first and the second stage sensing are triggered in parallel. With this approach, the sensing speed is significantly improved, since switching of the second stage does not have to wait for the completion of the first stage (as in a cascaded design). Furthermore, since the output nodes 6 and 7 are isolated from the sense lines STI 12 and SCI 14, they are not being loaded down by the large bit line capacitance imposed on the sense lines STI 12 and SCI 14, hence their switching speed (slew rate) is much improved. Nodes 6 and 7 can now handle very large output devices to provide high power output driving capability.

Figure 5:
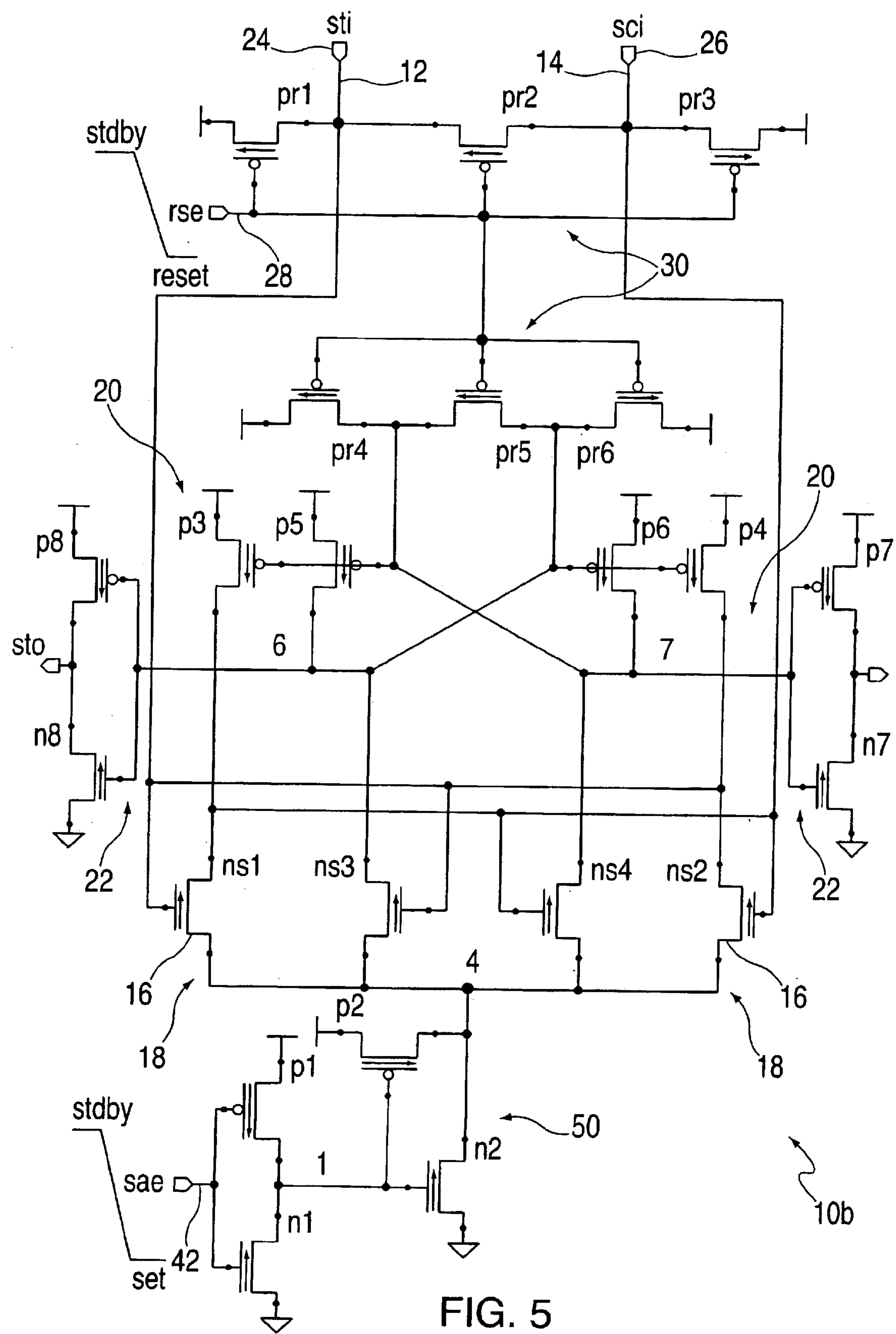
FIG. 5 illustrates a second version of the high performance parallel stage sense amplifier circuit having tri-state dynamic output in accordance with an exemplary embodiment.

The output driver 22, includes, but is not limited to, a pair of high power inverters formed in this embodiment, by complementary devices p7/n7 and p8/n8 to provide true and complement dynamic outputs. Alternatively, the output driver 22 could be form using a high power push-pull circuit including transistor pairs p7/n7 and p8/n8 to provide tri-state dynamic output. FIG. 5 depicts yet another alternative embodiment of a sense amplifier 10*b* employing a push-pull circuit to form the output driver 22. The inverters or push-pull circuit are connected to and driven by the second stage 20 cross-coupled complementary devices.

Continuing with FIGS. 4 and 5, operation of the sense amplifier 10*a* and 10*b* initiates with the precharging (establishing a known voltage at selected nodes in the sense amplifier 10*a* and 10*b*. Prior to a read operation (or in standby mode), the sti/sci (sense line signals STI 12 and SCI 14) are precharged to $V_{dd}$ by lowering the reset enable input signal 28 rse to turn on the PMOS precharge devices (pr1-pr3) and (pr4-pr6). Once a read operation starts, the precharge devices are turned off by the reset enable signal 28 rse switching high. A selected memory cell on a given bit line is activated, depending on the data polarity on the memory cell, either bit or blc (FIG. 1) (connected to sti and sci respectively) is pulled lower while the other side stays high, gradually developing a small voltage differential across the sense lines STI 12 and SCI 14. When sufficient differential voltage is attained on the sti/sci inputs (this timing is predetermined by a sense amp timing generator within the SRAM structure, not shown here), the sae signal (coming from the sense amplifier timing generator) is triggered. It turns on the first stage sensing devices 16 ns1/ns2 and the second stage sensing devices 20 ns3/ns4 concurrently to amplify the input sense line differential. This parallel dual-stage sensing scheme helps build a much bigger differential voltage with faster slew rate on internal nodes 6 and 7, which provides full $V_{dd}$ swing to drive the output devices. The outputs of this sense amplifier 10*a* and 10*b* are dynamic in nature (that is, the signals are pulses) with either true/complement or tri-state outputs.

It will be appreciated that the use of first and second or other similar nomenclature for denoting similar items is not intended to specify or imply any particular order unless otherwise stated.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A sense amplifier for a memory device comprising:

a first sensing stage comprising a first sending device and a second sensing device;

a first sensing line and a second sense line directly connected to a gate of said first sensing device and a gate of said second sensing device, respectively, to reduce capacitive load on said first sense line and said second sense line;

wherein a source terminal of said first sensing device and said second sensing device, respectively, is connected to a switchable current sink and a drain terminal of said first sensing device and said second sensing device, respectively, connected to an input of a second sensing stage;

said second sensing stage comprising cross-coupled inverters responsive to said first sensing stage, said second sensing stage activated by a sense enable signal following a selected delay, wherein said first sensing stage is deactivated once said second sensing stage is activated;

an output driver responsive to said second sensing stage;

wherein said second sensing stage of said sensing stage of said sense amplifier, when activated, provides a feedback signal to deactivate said first sensing stage so that at any time only one of said first sensing stage and said second sensing state is active.

2. The sense amplifier of claim 1 wherein said first sensing stage employs sensing devices exhibiting less capacitance than said second sensing stage and said output driver to reduce current and capacitive loading on said sense lines.

3. The sense amplifier of claim 1 wherein activation of said first sensing stage and second sensing stage of the said sense amplifier are controlled in a sequential manner, wherein said first stage sensing stage is activated and a selected delay later, said second sensing stage is activated.

4. The sense amplifier of claim 3 wherein said selected delay is provided by a pair of CMOS inverters configured to manipulate timing of activation of said second sensing stage.

5. The sense amplifier of claim 1 further including a precharge of selected dynamic nodes of said sense amplifier.

6. A sense amplifier for a memory device comprising:

a first sensing stage comprising a first sending device and a second sensing device;

a first sensing line and a second sense line directly connect to a gate of said first sensing device and a gate of said second sensing device, respectively, to reduce capacitive load on said first sense line and said second sense line;

wherein a source terminal of said first sensing device and said second sensing device, respectively, is connected to a switchable current sink and a drain terminal of said first sensing device and said second sensing device, respectively, connected to an input of a second sensing stage;

said second sensing stage comprising cross-coupled inverters responsive to said first sensing stage, said second sensing stage activated by a sense enable signal following a selected delay, wherein said first sensing stage is deactivated once said second sensing stage is activated;

an output driver responsive to said second sensing stage;

a precharge of selected dynamic nodes of said sense amplifier;

wherein said output driver is a high speed push-pull circuit connected to said second sensing stage, said output driver configured to ensure that said precharge deactivates said output driver, and thereby, said sense amplifier exhibits a high impedance state at an output thereof.

7. A method of detecting a signal on a pair of complementary sense lines in a dual-stage sense amplifier for a memory device comprising:

detecting a differential voltage between a first sense line and a second sense line with a first sensing stage comprising a first sensing device and a second sensing device;

amplifying said differential voltage with a second sensing stage comprising cross-coupled inverters responsive to said first sensing stage, said second sensing stage activated by a sense enable signal following a selected delay, wherein said first sensing stage is deactivated once said second sensing stage is activated;

generating a output signal with as output driver responsive to said second sensing stage; and deactivating said first sensing stage when said second sensing stage of said sense amplifier is activated so that at any time only one of said first sensing stage and said second sensing stage is active.

8. The method of claim 7 wherein said first sensing stage employs sensing devise exhibiting less capacitance than said second sensing stage and said output driver to reduce current and capacitive loading on said sense lines.

9. The method of claim 7 wherein said amplifying includes generating a substantially rail-to-rail voltage swing to drive said output driver.

10. The method of claim 7 wherein deactivating of said first sensing stage and second sensing stage of the said sense amplifier are controlled in a sequential manner, wherein said first stage sensing stage is activated and a selected delay later, said second sensing stage is activated.

11. The method of claim 7 further including precharging selected dynamic nodes of said sense amplifier.

12. The method of claim 11 wherein said precharging includes voltage equalization between signal phases of said sense lines.

13. A method of detecting a signal an a pair of complementary sense lines in a dual-stage sense amplifier for a memory device comprising;

detecting a differential voltage between a first sense line and a second sense line with a first sensing stage comprising a first sensing device and a second sensing device;

amplifying said differential voltage with a second sensing stage comprising cross-coupled inverters responsive to said first sensing stage, said second sensing stage activated by a sense enable signal following a selected delay, wherein said first sensing stage is deactivated once said second sensing stage is activated;

generating a output signal with an output driver responsive to said second sensing stage;

a precharge of selected dynamic nodes of said sense amplifier, said precharging includes voltage equalization between signal phases of said sensing lines; and wherein said output driver is a high speed push-pull circuit connected to said second sensing stage, said output driver configured to ensure that said precharging deactivates said output driver, and thereby, said sense amplifier exhibits a high impedance state at an output thereof.

14. A sense amplifier for a memory device comprising:

first sensing stage comprising a first sensing device and a second sensing device;

a first sense line and a second sense line directly connected to a gate of said first sensing device and a gate of said second sensing device, respectively, to reduce capacitive load on said first sense line and said second sense line;

wherein a source terminal of said first sensing device and said second sensing device, respectively, is connected to a switchable current sink and a drain terminal of said first sensing device and said second sensing device, respectively, connected to an input of a second sensing stage;

said second sensing stage comprising a pair of cross-coupled complementary inverters coupled to said switchable current sink, responsive to said first sensing stage and operably connected to said first sense line and said second sense line, said second sensing stage activated by a sense enable signal;

an output driver responsive to said second sensing stage;

a precharge of selected dynamic nodes of said sense amplifier; and wherein said output driver is a high speed push-pull circuit connected to said second sensing stage, said output driver configured to ensure that said precharged deactivates said output driver, and thereby, said sense amplifier exhibits a high impedance stage at an output thereof.

15. The sense amplifier of claim 14 wherein said current sink concurrently activates both said first sensing stage and said second sensing stage in parallel.

16. The sense amplifier of claim 14 wherein said first sensing stage employs sensing devices exhibiting less capacitance than said second sensing stage and said output driver to reduce current and capacitive loading on said sense lines.

17. The sense amplifier of claim 14 wherein activation of said first sensing stage and second sensing stage of the said sense amplifier are controlled in a concurrent manner, wherein said first sensing stage is activated parallel with said second sensing stage.

18. A sense amplifier for a memory device comprising:

first sensing stage comprising a first sensing device and a second device;

a first sense line and a second sense line directly connected to a gate of said first sensing device and a gate of said second sensing device, respectively, to reduce capacitive load on said first sense line and said second sense line;

wherein a source terminal of said first sensing device and said second sensing device, respectively, is connected to a switchable current sink and a drain terminal of said first sensing device and said second sensing device, respectively, connected to an input of a second sensing stage;

said second sensing stage comprising a pair of cross-coupled complementary inverters coupled to said switchable current sink, responsive to said first sensing stage and operably connected to said first sense line and said second sense line, said second sensing stage activated by a sense enable signal;

an output driver responsive to said second sensing stage;

a precharge of selected dynamic nodes of said sense amplifier; and wherein said output driver is a pair of high speed CMOS inverter circuits connected to said second sensing stage, said output driver configured to ensure that said precharged deactivates said output driver, and thereby, said sense amplifier exhibits a dynamic true and complement state at an output thereof.

19. A method of detecting a signal on a pair of complementary sense lines in a dual-stage sense amplifier for a memory device comprising:

detecting a differential voltage between a first sense line and a second sense line with a first sensing stage comprising a first sensing device and a second sensing device;

amplifying said differential voltage with a second sensing stage comprising cross-coupled inverters responsive to and in parallel with said first sensing stage, said second sensing stage activated by a sense enable signal;

generating a output signal with as output driver responsive to said second sensing stage; and wherein said output driver is a high speed push-pull circuit connected to said second sensing stage, said output driver configured to ensure that said precharged deactivates said output driver, and thereby, said sense amplifier exhibits a high impedance state at an output thereof.

20. The method of claim 19 wherein said first sensing stage employs sensing devices exhibiting less capacitance than said second sensing stage and said output driver to reduce current and capacitive loading on said sense lines.

21. The method of claim 19 wherein said amplifying includes generating a substantially rail-to-rail voltage swing to drive said output driver.

22. The method of claim 19 further including activating said first sensing stage concurrently with said second sensing stage of said sense amplifier is activated so that at any time both of said first sensing stage and said second sensing stage are active.

23. The method of claim 19 wherein said activating of said first sensing stage and said second sensing stage are controlled by an input timing signal, said input timing signal is an active low dynamic signal with a selected pulse width.

24. The method of claim 19 further including precharging selected dynamic nodes of said sense amplifier.

25. The method of claim 19 wherein said precharging includes voltage equalization between signal phases of said sense lines.

* * * * *